United States Patent [19]
Mayuzumi et al.

[11] Patent Number: 5,916,824
[45] Date of Patent: Jun. 29, 1999

[54] ETCHING METHOD OF SILICON WAFER SURFACE AND ETCHING APPARATUS OF THE SAME

[75] Inventors: Masanori Mayuzumi; Katsuaki Yoshizawa; Yoshinori Hayamizu, all of Gunma-ken, Japan

[73] Assignee: Shin-Etsu Handotai Co., Ltd., Tokyo, Japan

[21] Appl. No.: 08/655,166

[22] Filed: May 30, 1996

[30] Foreign Application Priority Data

Jun. 2, 1995  [JP]  Japan ................................. 7-160001

[51] Int. Cl.$^6$ ................................. C23F 1/02; C23F 1/08
[52] U.S. Cl. ................................. 438/753; 156/345
[58] Field of Search ................................. 216/84, 87, 99; 134/2, 3; 156/345; 252/79.3, 79.4; 438/753

[56] References Cited

U.S. PATENT DOCUMENTS

| | | | |
|---|---|---|---|
| 3,798,061 | 3/1974 | Yamazaki | 117/213 |
| 4,902,351 | 2/1990 | Kunze et al. | |
| 5,129,955 | 7/1992 | Tanaka | 134/2 |
| 5,242,831 | 9/1993 | Oki | 436/5 |
| 5,395,482 | 3/1995 | Onda et al. | 156/646 |

FOREIGN PATENT DOCUMENTS 0 396 002  7/1990  European Pat. Off. .

*Primary Examiner*—Donna Wortman
*Assistant Examiner*—Brenda G. Brumback
*Attorney, Agent, or Firm*—Ronald R. Snider; Snider & Chao, LLP

[57] ABSTRACT

A silicon wafer is held in an airtight chamber by a silicon wafer holder. The silicon wafer holder is cooled by a cooler. High purity nitric acid is stored in a storage container disposed in the airtight container. The storage container is heated by a heater, thereby producing nitric acid gas. The nitric acid gas is condensed on the surface of the silicon wafer so that a thin film is formed. Thus, the surface of the silicon wafer is rendered hydrophilic. Thereafter, high purity hydrofluoric acid is dropped on high purity nitric acid in the storage container by an acid dropper, thereby producing hydrofluoric acid gas. By introducing the hydrofluoric acid gas into the thin film formed on the surface of the silicon wafer, an etching is performed while maintaining the surface of the silicon wafer in a good condition.

21 Claims, 3 Drawing Sheets

(a) AFTER ETCHING ACCORDING TO PRESENT INVENTION
(b) AFTER ETCHING ACCORDING TO CONVENTIONAL METHOD
(c) EPITAXIAL WAFER
(d) MIRROR POLISHED WAFER under the patent application No. 160001/1995 (filed on

ETCHING METHOD OF SILICON WAFER SURFACE AND ETCHING APPARATUS OF THE SAME

The present disclosure relates to subject matter contained in Japanese patent application No. 160001/1995 (filed on Jun. 2, 1995) which is expressly incorporated herein by reference in its entirety.

BACKGROUND OF THE INVENTION

1. Field of the Invention

The present invention relates to an etching method of a silicon wafer surface and an apparatus of etching thereof in order to analyze an exceedingly slight quantity of metal impurities contained in the silicon wafer surface, in a thin film formed on the silicon wafer surface, or a surface layer of the silicon wafer.

More particularly, this invention relates to an etching method and an apparatus of etching thereof in order to analyze an extremely slight quantity of metal impurities contained in the surface layer of the silicon wafer.

2. Description of the Prior Art

It has been known that metal impurities in a silicon wafer surface, a surface layer of a silicon wafer, or a thin film formed on the surface affect adversely on electrical characteristics of semiconductor devices. For this reason, Analyzing methods of metal impurities in the silicon wafer surface, the surface layer, or the thin film such as a thermal oxide film have been heretofore investigated.

A representative method which has been investigated is called a vapor phase decomposition method. In Japanese Patent Publication No. 58927/1994, an analyzing method of impurities in a semiconductor thin film and a recovery apparatus of a decomposed liquid for an analysis is disclosed wherein a semiconductor wafer is arranged vertically within an airtight chamber, a thin film formed on the surface of the semiconductor wafer is decomposed with hydrogen fluoride vapor, and decomposed liquid is collected in a collection container disposed in the lower portion of the airtight chamber to be analyzed.

Furthermore, Japanese Patent Publication No. 43289/1993 discloses a method of analyzing a semiconductor thin film and an apparatus thereof wherein a semiconductor wafer is arranged horizontally, only one side surface of the semiconductor wafer is exposed to hydrogen fluoride vapor, and a thin film is decomposed.

All of these inventions use hydrogen fluoride gas for decomposing the thin film formed on the surface of the semiconductor wafer. Hydrogen fluoride gas is able to decompose the thin film such as a natural oxide film and a thermal oxide film formed on the silicon wafer. However, hydrogen fluoride gas is impossible to etch silicon itself so that impurities contained in the vicinity of the surface of the wafer, that is, impurities in surface layer can not be recoverd.

For an evaluation method of metal impurities in a silicon wafer surface layer, Japanese Patent Publication No. 44830/1993 and No. 31940/1993 disclose a method wherein a low temperature oxidation is performed in a specific reaction apparatus and a vapor phase decomposition of the formed oxide film is subsequently carried out. There is a drawback that this method requires the specific reaction apparatus, and that because respective elements consisting in metal impurities are introduced into the oxide film in different ways, some of the elements can not be evaluated with a high sensitivity in this method.

On the other hand, a method has been known wherein a silicon wafer is etched with mixed acid made of hydrofluoric acid and nitric acid, etching solution is collected, and subsequently metal impurities contained in the collected liquid are analyzed. In Japanese Patent Publication No. 30209/1993 and Japanese Patent Publication No. 57422/1991, for example, a sample decomposition apparatus and a sample decomposition method using this apparatus are disclosed wherein a container containing pure water in which a silicon wafer is dipped is located in an airtight chamber, acidic gas is produced by heating a hydrofluoric acid and nitric acid container in the airtight chamber, and metal impurities dissolved into the pure water by etching the wafer are analyzed with a frame-less atomic absorption spectrometry apparatus.

However, as clearly remarked from that an etching is carried out as to the whole portion of a silicon wafer in the embodiment, a silicon wafer is dipped in pure water when performing this method. Therefore, controlling of the etching amount is difficult so that it is impossible to analyze the wafer surface layer with a precision.

To solve this problem, Japanese Patent Application Laid Open 211223/1993 discloses a method to analyze only the silicon water surface layer. Specifically, a silicon wafer is horizontally located in an airtight chamber, and a silicon piece as a catalyzer for producing gas is dipped in mixed acid composed of hydrofluoric acid and nitric acid thereby producing mixed gas composed of Nox and HF. An etching of the silicon wafer surface is carried out by the mixed gas, and pure water is dropped on the surface after being subjected to the etching. Metal impurities are collected by recovering the water, and the impurities are subjected to atomic absorption spectrometry.

Furthermore, Japanese Patent Application Laid Open 213805/1994 discloses a method wherein after the contents of nitric acid and hydrogen fluoride contained in mixed acid are normalized, the surface of a silicon wafer is etched by heating the mixed acid, condensed liquid is collected without using chemicals, and the liquid is analyzed.

With the foregoing methods, a large amount of hydrogen fluoride gas is produced at the initial stage of the reaction (the reason for the action is unknown), and the surface of the silicon wafer is terminated with hydrogen by hydrogen fluoride so that the surface of the silicon wafer is partially rendered hydrophobic. Uneven etching is apt to be produced so that the surface of the silicon wafer is not etched uniformly. Or else, surface roughness is produced. These defects are considered to be caused by the above behavior. When the surface roughness is produced on the surface of the silicon wafer after etching, scanning of a pure water drop on the surface of the silicon wafer is difficult at the time of the collection of metal impurities using a pure water drop disclosed in Japanese Patent Application Laid Open 211223/1993. Furthermore, collection of dew condensed liquid by blowing cleaning gas onto the surface of the silicon wafer, disclosed in Japanese Patent Application Laid Open 213805/1994, is difficult.

SUMMARY OF THE INVENTION

The object of the present invention is to provide an etching method of a silicon wafer surface and an apparatus of etching thereof, which is suitable for a high sensitivity analysis of heavy metal impurities contained in the silicon wafer surface or surface layer thereof, and is capable of etching uniformly the silicon wafer surface without producing surface roughness.

An etching method of a silicon wafer surface according to the present invention comprising the steps of:

supporting a silicon wafer horizontally in an airtight chamber;

supplying the first component acid gas into the airtight chamber, or producing the first component acid gas in the airtight chamber;

liquefying the first component acid gas to form a thin film of acid on the surface of the silicon wafer thereby making the surface of the silicon wafer hydrophilic;

supplying the second component acid gas into the airtight chamber, or producing the second component acid gas in the airtight chamber; and introducing the second component acid gas into the first component acid thin film thereby etching the surface of the silicon wafer.

As for the etching method of the surface of the silicon wafer according to the present invention, in order to supply the first component acid gas into the airtight chamber, a method may be adopted wherein a first component acid contained in an acid storage container disposed outside the airtight chamber is heated, and produced gas is supplied into the airtight chamber via a pipe. The second component acid gas can be supplied into the airtight chamber according to a similar way.

In order to produce the first component acid gas in the airtight chamber, a method may be adopted wherein the first component acid is stored in an acid storage container disposed in the airtight chamber, and the first component acid is heated. To carry out this method, the acid storage container may be heated or heating means may be dipped in the first component acid. By dropping the second component acid on the liquid surface of the heated first component acid, the second component acid is heated so that gas of the second component acid can be produced.

In order to liquefy gas of the first component acid or gas or the second component acid on the surface of the silicon wafer, it should be preferable that the silicon wafer is cooled suitably by cooling means.

High purity nitric acid and high purity hydrofluoric acid should be preferably used as the combination of the first and second component acid.

Specifically, in a most preferred embodiment, an etching method of a silicon wafer surface according to the present invention comprising the steps of:

a silicon wafer is supported horizontally in an airtight chamber;

high purity nitric acid is stored in a storage container disposed in the airtight chamber;

heating the high purity nitric acid thereby producing nitric acid gas;

liquefying the nitric acid gas on the surface of the silicon wafer to form a thin film of the acid thereby making the surface of the silicon wafer hydrophilic;

dropping high purity hydrofluoric acid on nitric acid in the storage container to heat hydrofluoric acid thereby producing hydrofluoric acid gas; and introducing hydrofluoric acid gas into the thin film thereby etching the surface of the silicon wafer.

This etching method will be hereinafter referred to as a nitric/hydrofluoric acid method.

To maintain the surface of the silicon wafer in good conditions (see the later description) after the etching using the nitric/hydrofluoric acid method and to obtain a sufficient etching rate, a dropping ratio of hydrofluoric acid to nitric acid, i.e., an addition ratio, is critical. It should be preferable that the addition ratio is 0.008 to 0.03 mole for nitric acid of 1 mole and total amount of water in a mixture of nitric acid and hydrofluoric acid contained in the storage container after the dropping of hydrofluoric acid is 1.45 to 1.55 mol for nitric acid of 1 mole.

When the addition ratio of hydrofluoric acid is less than 0.008, the sufficient etching rate can not be obtained. When the addition ratio of hydrofluoric acid is larger than 0.03, the surface of the silicon wafer is partially made hydrophobic so that a good surface condition of the silicon wafer can not be obtained after etching. Furthermore, when a total amount of water contained in the mixed acid in the storage container is less than 1.45 mole for nitric acid of 1 mole, it is hard to obtain a good surface condition of the silicon wafer after etching. When the total amount of water exceeds 1.55 mol, a sufficient etching rate can not be obtained.

In the nitric/hydrofluoric acid method, a heating temperature of nitric acid should be preferably 90 to 110 ° C. The reason for this is that an evaporation efficiency of nitric acid gas is low at the heating temperature lower than 90° C. so that the time for forming the thin film on the surface of the silicon wafer is long, and hydrogen fluoride gas is rapidly produced at the time of addition of hydrofluoric acid at the heating temperature higher than 110 ° C. so that good conditions of the surface of the silicon wafer can not be maintained after the etching.

An etching amount of the silicon wafer surface or the surface layer thereof in the etching method of the present invention should be preferably 0.1 to 3.0 $\mu$m though it depends on concentrations of heavy metal impurities contained in the silicon wafer surface or the surface layer thereof.

When the etching amount is less than 0.1 $\mu$m, the sensitivity for impurities is lowered and the measurement of the etching amount with precision is difficult. When the etching amount is larger than 3.0 $\mu$m, an etching time is long.

In the etching method of the present invention, the foregoing "good surface condition" means a grade at which liquid drop scanning using pure water or chemicals such as dilute hydrofluoric acid, mixed acid of dilute hydrofluoric acid and hydrogen peroxide aquaous solution, and mixture of dilute hydrochloric acid and hydrogen peroxide aquaous solution or condensed water collection by blowing pure gas is carried out easily, and roughness Ra measured by a contact probe roughness measurement apparatus is within the range of 0.5 to 5.0 nm.

Since it is impossible to measure the roughness Ra less than 0.5 nm with the contact probe roughness measurement apparatus, the roughness should not exceed 5.0 nm though it is the measurable roughness. Furthermore, when the surface of the silicon wafer is in the "good surface condition", it is possible to analyze the metal impurity distribution in the depth direction with a high precision.

Furthermore, an etching apparatus of a silicon wafer surface of the present invention comprises an airtight chamber; holding means for holding horizontally a silicon wafer in the airtight charter; an acid storage container which stores a first component acid; heating means for heating the first component acid in the acid storage container; and acid dropping means for dropping a second component acid in the acid storage container.

This apparatus is suitable for carrying out the etching by the nitric/hydrofluoric acid method.

Heating means for heating the first component acid in the acid storage container is preferably an electric heater for heating the acid storage container and heating means for heating the inner wall of the airtight chamber is also desirably an electric heater. These heating means and electric wires connecting these heating means to the electric power source are preferably covered with tetrafluoroethylene type resin, or these heating means are advantageously buried in tetrafluoroethylene type resin.

The aforementioned airtight chamber, silicon wafer holding means, the acid storage container, and acid dropping means are desirably covered with tetrafluoroethylene type resin, or are preferably formed of tetrafluoroethylene type resin.

As described above, with the formation of the surfaces of main portions of the etching apparatus of the present invention from tetrafluoroethylene type resin, contaminations of the silicon wafer surface at the etching processes can be prevented.

Silicon wafer holding means preferably have a concave slightly larger than the silicon wafer so that only one surface of the silicon surface is etched. Silicon wafer holding means may have the structure that only outermost portion of the silicon wafer is held. It is desirable that acid dropping means is a pipe formed of tetrafluoroethylene type resin, acid storage container capable of measuring the dropping amount, which stores the second component acid, is disposed outside the airtight chamber, and the acid storage container and acid dropping means are connected with a pipe having a valve.

In order to prevent that condensed liquid of the acid on the inner wall of the airtight chamber just above the silicon wafer falls on the surface thereof so that the surface of the silicon wafer will be contaminated, heating means for heating the inner wall of the airtight chamber just above the position where the silicon wafer is held is desirably disposed at a proper position, for example, on the inner wall of the airtight chamber.

To facilitate the condensation of the first and second component acid gases on the surface of the silicon wafer, silicon wafer holding means preferably comprise cooling means for cooling the silicon wafer. A coolant supplying pipe is desirably connected to the cooling means. The cooling means and the pipe are desirably covered with tetrafluoroethylene type resin, or are preferably formed of tetratluoroethylene type resin.

In an etching method of the present invention, nitric acid, for example, is used as a first component acid, and nitric acid gas is condensed on the surface of a silicon wafer so that a thin film formed of nitric acid is formed. Thus, the surface of the silicon wafer is rendered hydrophilic. Thereafter, using, for example, hydrofluoric acid as a second component acid, hydrogen fluoride gas is introduced into the thin film formed of the first component acid so that a thin film formed of hydrofluoric acid is formed. Etching of the surface of the silicon wafer is performed by the thin film formed of hydrofluoric acid.

According to the etching method described above, since the surface of the silicon wafer is maintained to be hydrophilic by the thin film formed of nitric acid, the uniformity of the etching rate over the surface of the silicon wafer is increased so that the "good surface condition" can be maintained.

BRIEF DESCRIPTION OF THE DRAWINGS

An embodiment of the present invention will now be described by way of example and with reference to the accompanying drawings, in which.

DETAILED DESCRIPTION OF THE PREFERRED EMBODIMENT

Figure 1:
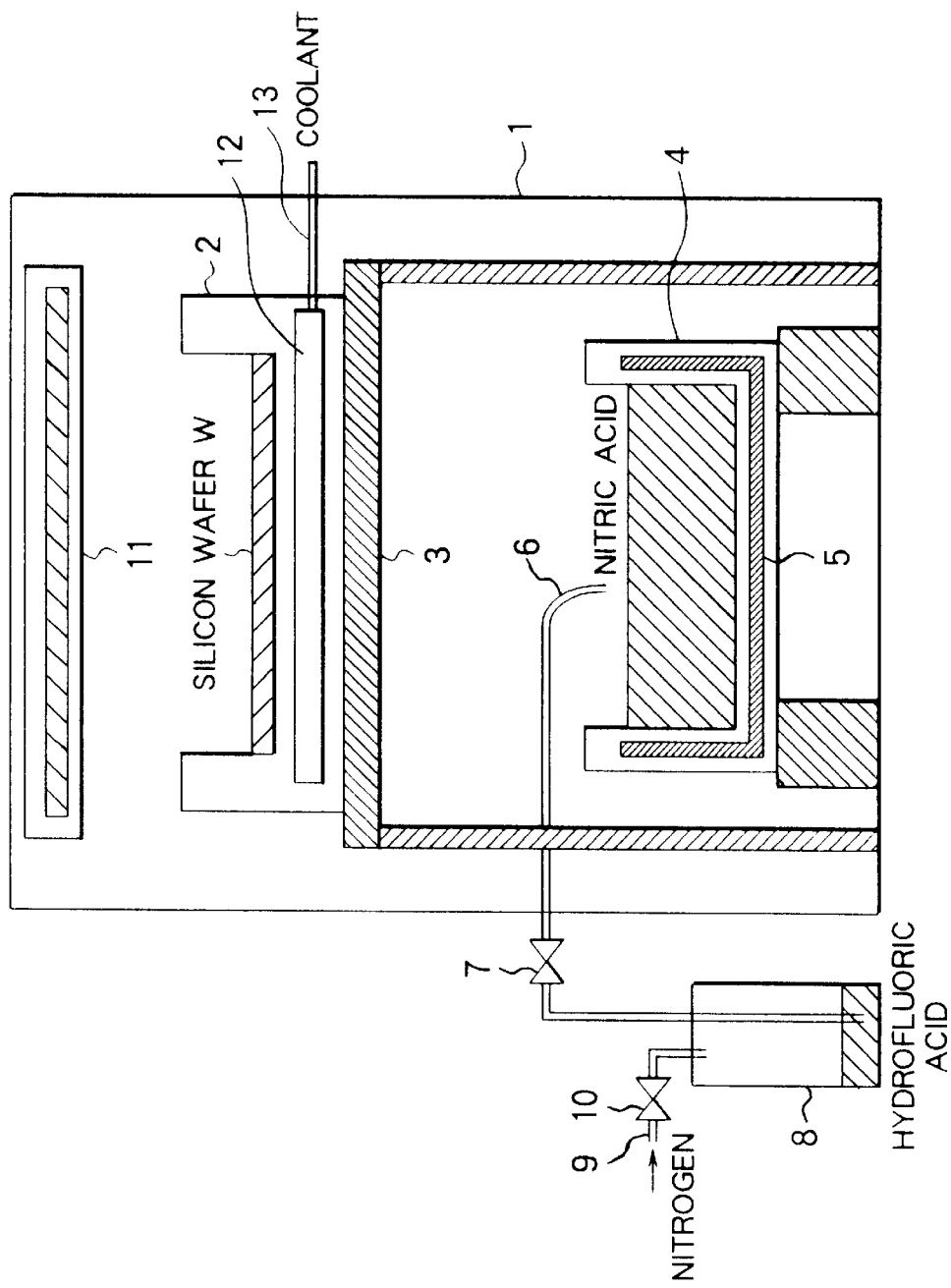
FIG. 1 is a schematic sectional view showing an example of an etching apparatus of the present invention.

An embodiment of the present invention will now be described with reference to the accompanying drawings. FIG. 1 is a sectional schematic view of an etching apparatus for etching the surface of a silicon wafer W. Referring to FIG. 1, the etching apparatus comprises, in an airtight chamber 1, a silicon wafer holding means 2, a stage 3 for supporting the wafer holding means 2, a first component acid storage container 4 disposed just below the wafer holding means 2, a heating means 5 buried in the side wall and bottom wall of the acid storage container 4, a second component acid dropping means ( pipe-shaped member ) 6 disposed just above the acid storage container 4.

Cooling means 12 capable of supplying coolant with a pipe 13 is disposed at a lower portion of the silicon wafer holding means 2. The second component acid dropping means 6 is connected to a second component acid storage container 8 via a valve 7 positioned outside of the airtight chamber 1. The second component acid storage container 8 is outside of the airtight chamber 1. The second component acid storage container 8 is sealed hermetically, and is pressurized by high purity nitrogen supplied through a pipe 9 equipped with a valve 10. The second component acid stored in the acid storage container 8 is dropped, by opening the valve 7, from the acid dropping means 6 disposed just above the first component acid storage container 4 within the airtight container 1.

The airtight container 1, the silicon wafer holding means 2, the stage 3, the first component acid storage container 4, the second component acid dropping means 6, the valve 7, the second component acid storage container 8, the pipe 9, the valve 10, the cooling means 12, and the pipe 13 are formed of tetrafluoroethylene type resin. It is noted that an observation window (not shown) for observing the inside of the airtight chamber 1 is provided in the airtight chamber 1. The airtight chamber 1 comprises a heating means 11 covered with tetrafluorcethylene type resin on its inner wall disposed just above the silicon wafer holding means 2.

Next, an example of etching tests using the foregoing etching apparatus will be described.

An epitaxial silicon wafer prepared by growing a P type epitaxial layer of 10 Ω·cm having a thickness of 10 μm on a P type silicon substrate of 0.015 Ω·cm was used as a tested silicon wafer. As to this sample, the thickness of the epitaxial layer was previously measured by a Fourier transformation infrared spectrometer, and then this sample was mounted on the silicon wafer holding means 2.

After high purity nitric acid of 61% by weight was poured by 197 to 199 ml into the first component acid storage container 4, heating with the heating means 5 was started so that the temperature of high purity nitric acid was raised to 100° C. At the same time, heating with the heating means 11 was also started to prevent the condensation of gas on the inner wall of the airtight chamber 1, which is disposed just above the silicon wafer.

Figure 2:
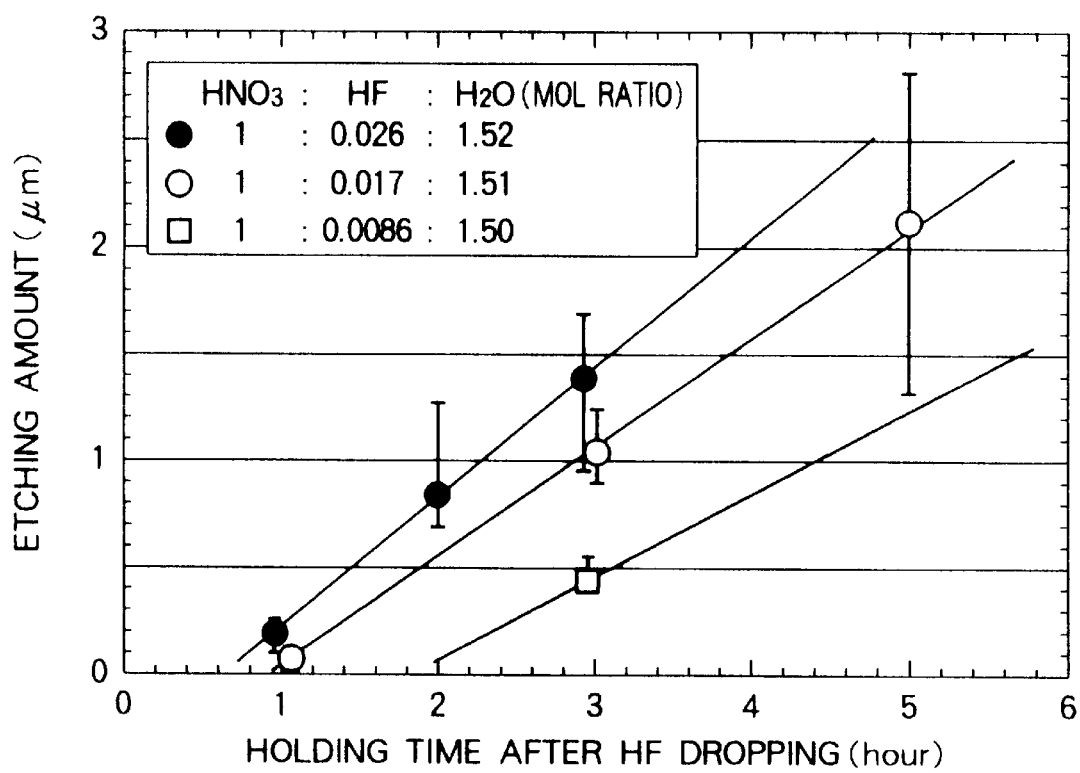
FIG. 2 is a graph showing the test results concerning etching amount using the etching apparatus of the present invention, concretely in other words the relation between the holding time after the dropping of hydrofluoric acid and the etching amount.

After it was confirmed that the temperature of high purity nitric acid rose to 100° C. and was condensed to a thin film on the entire surface of the silicon wafer, high purity hydrofluoric acid of 50% by weight in the second component acid storage container 8 was dropped by a predetermined amount from the second component acid dropping means 6. Mole ratios of nitric acid, hydrofluoric acid, and water were 1: 0.026:1.52, 1:0.017:1.51, and 1:0.0086:150. Etching amounts for holding time after dropping of hydrofluoric acid were measured. The results of the measurements are shown in FIG. 2. The etching amounts were calculated by measuring the thickness of the epitaxial layer before and after the etching.

As shown in FIG. 2, the etching amount increases in proportion to the holding time after the dropping of hydrofluoric acid. It is seen that the etching rate is larger as the dropping amount of hydrofluoric acid is increased. It is found that unevenness of the etching rate on the surface of the silicon wafer is apt to be large and the surface of the silicon wafer is apt to be much roughened, with the increase in the dropping amount of hydrofluoric acid. When the dropping amount of hydrofluoric acid is reduced, the surface of the silicon wafer is kept in a good condition. However, the etching rate is small so that it is difficult to achieve the desired etching amount.

The optimized conditions to obtain the desired etching amount are that nitric acid, hydrofluoric acid, and water are in the mole ratio of 1:0.017:1.51 and the holding time is three hours after the dropping of hydrofluoric acid.

Figure 3:
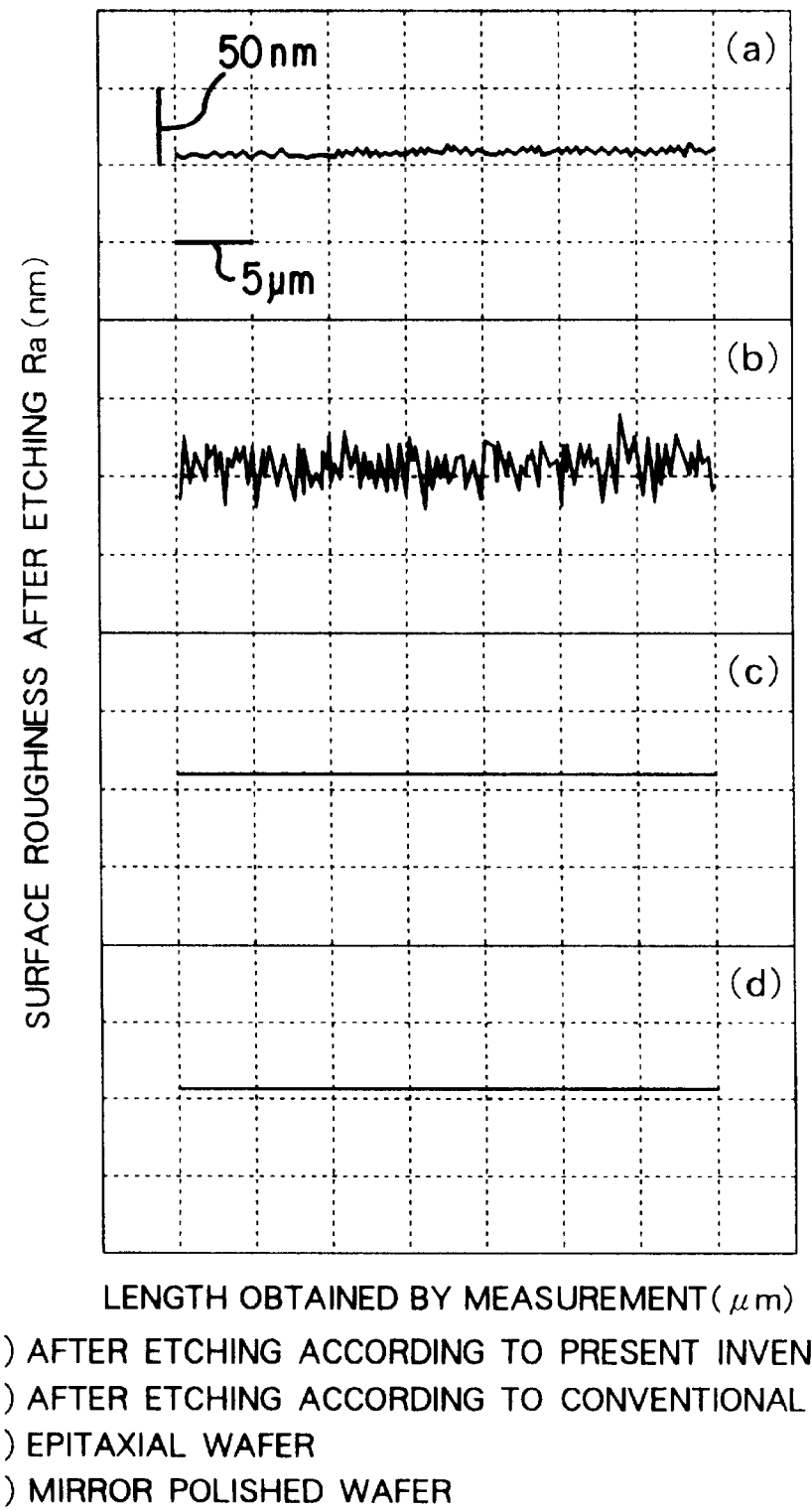
FIG. 3 is a chart showing surface roughnesses of silicon wafers, which is obtained by a contact probe roughness measurement apparatus as to a silicon wafer etched by the etching method of the present invention, a silicon wafer etched by a conventional etching method, an epitaxial wafer, and a mirror polished wafer.

After the silicon wafer subjected to the etching under the optimized conditions was rinsed with pure water, the surface roughness was measured with a contact probe roughness measurement apparatus. The measurement result is shown in Fig. 3a. For the comparison with other examples, FIG. 3b, FIG. 3c, and FIG. 3d showing the measurement results of the surface roughnesshare illustrated. FIG. 3b shows the measurement result for the silicon wafer which is etched in the following manner. Specifically, using the etching apparatus shown in FIG. 1, high purity nitric acid and high purity hydrofluoric acid were introduced into the first component acid storage container 4 so as to obtain the same mole ratio as the optimized condition of this embodiment. Thereafter, they were heated thereby etching the silicon wafer. This procedures corresponds to the conventional method. Then, the surface roughness of the silicon wafer subjected to the etching was measured with the contact probe roughness measurement apparatus. FIG. 3c shows the measurement result for an epitaxial silicon wafer (EPW) and FIG. 3d a mirror polished silicon wafer (PW) before being etched. It is noted that the "measure length" of the abscissa in FIG. 3 represents the length obtained by the measurement with the exploring probe of the contact probe roughness measurement apparatus.

The roughness of the silicon surface is 25 nm at Ra, which is etched while nitric acid and hydrofluoric acid are simultaneously heated. In this silicon wafer, it is difficult to collect impurities by liquid drop manipulation because the surface of the silicon wafer is hydrophilic. Contrary to this, the surface roughness of the silicon wafer etched in accordance with the etching method of the present invention is less than 5 nm at Ra. Although the surface of this silicon wafer is hydrophilic immediately after the dropping of hydrofluoric acid and hydrogen peroxide, when the thin film produced by etching is dissolved by hydrofluoric acid, the surface of the silicon wafer is rendered hydrophobic. It is easy to collect impurities by liquid drop.

As described above, according to the present invention, an etching method of a silicon wafer surface and an etching apparatus of the same can be provided, which is suitable for a high sensitivity analysis of heavy metal impurities in a surface of a silicon wafer or a surface layer. Furthermore, the etching method and the etching apparatus of the present invention can achieve the high uniformity of etching amount over the surface of the silicon wafer, and can prevent the production of the roughened surface of the silicon wafer.

Furthermore, according to the present invention, impurities of a surface of a SOI (Silicon on Insulator) wafer such as SIMOX and a bonded wafer as well as the mirror polished wafer and the epitaxial wafer can be analyzed. Evaluation for the contamination in semiconductor manufacturing processes such as ion implantation and dry etching can also be performed.

What is claimed is:

1. An etching method of a silicon wafer surface comprising the steps of:

holding a silicon wafer horizontally in an airtight chamber;

supplying the first component acid gas into said airtight chamber or producing the first component acid gas in said airtight chamber;

condensing the first component acid gas on a surface of said silicon wafer to form a thin film of the first component acid thereby rendering the surface of said silicon wafer hydrophilic;

supplying the second component acid gas into said airtight chamber, or producing the second component acid gas in said airtight chamber; and introducing the second component acid gas into the first component acid thin film thereby etching the surface of said silicon wafer.

2. An etching method of a silicon wafer surface according to claim 1 wherein the first component acid is high purity nitric acid.

3. An etching method of a silicon wafer surface according to claim 2 wherein an amount of the second component acid for the first component acid is 0.008 to 0.03 mole per 1 mole of the first component acid, and a total amount of water of a mixed acid in said storage container after dropping of the second component acid is 1.45 to 1.55 mole per 1 mole of the first component acid.

4. An etching method of a silicon wafer surface according to claim 3 wherein heating temperature of the first component acid is 90 to 110° C.

5. An etching method of a silicon wafer surface according to claim 2 wherein the second component acid is high purity hydrofluoric acid.

6. An etching method of a silicon wafer surface according to claim 2 wherein an etching amount of the surface of said silicon wafer is 0.1 to 3.0 μm.

7. An etching method of a silicon wafer surface according to claim 2 wherein a surface roughness of the surface of said silicon wafer obtained by a contact probe roughness measurement apparatus after completion of the etching is 0.5 to 5.0 mm of Ra value.

8. An etching method of a silicon wafer surface according to claim 2 wherein heating temperature of the first component acid is 90 to 110° C.

9. An etching method of a silicon wafer surface according to claim 1, wherein the second component acid is high purity hydrofluoric acid.

10. An etching method of a silicon wafer surface according to claim 9 wherein an amount of the second component acid for the first component acid is 0.008 to 0.03 mole per 1 mole of the first component acid, and a total amount of water of a mixed acid in said storage container after dropping of the second component acid is 1.45 to 1.55 mole per 1 mole of the first component acid.

11. An etching method of a silicon wafer surface according to claim 1 wherein an etching amount of the surface of said silicon wafer is 0.1 to 3.0 nm.

12. An etching method of a silicon wafer surface according to claim 1 wherein a surface roughness of the surface of said silicon wafer obtained by a contact probe roughness measurement apparatus after completion of the etching is 0.5 to 5.0 mm of Ra value.

13. An etching method of a silicon wafer surface comprising the steps of:

holding a silicon wafer horizontally in an airtight chamber;

storing a first component acid in a storage container disposed in said airtight chamber;

heating the first component acid to produce the first component acid gas;

condensing the first component acid gas on a surface of said silicon wafer to form a thin film of the first component acid thereby rendering the surface of said silicon wafer hydrophilic;

dropping a second component acid on the first component acid in said storage container and heating the second component acid to produce the second component acid gas; and introducing the second component acid gas into the thin film of the first component acid formed on the surface of said silicon wafer thereby etching the surface of said silicon wafer.

14. An etching method of a silicon wafer surface according to claim 13 wherein the first component acid is high purity nitric acid.

15. An etching method of a silicon wafer surface according to claim 13 wherein the second component acid is high purity hydrofluoric acid.

16. An etching method of a silicon wafer surface according to claim 13 wherein an etching amount of the surface of said silicon wafer is 0.1 to 3.0 $\mu$m.

17. An etching method of a silicon wafer surface according to claim 13 wherein a surface roughness of the surface of said silicon wafer obtained by a contact probe roughness measurement apparatus after completion of the etching is 0.5 to 5.0 mm of Ra value.

18. An etching apparatus of a silicon wafer surface comprising:

an airtight chamber;

holding means for holding horizontally a silicon wafer in said airtight chamber;

an acid storage container which stores the first component acid;

a first heating means for heating the first component acid in said storage container; and acid dropping means capable of dropping the second component acid into said acid storage container.

19. An etching apparatus of a silicon wafer surface according to claim 18 further comprising a second heating means in position for heating an inner wall of said airtight chamber just above the position where said silicon wafer is held.

20. An etching apparatus of a silicon wafer surface according to claim 19 wherein the first heating means heats said acid storage container by an electric heat;

the second heating means heats said inner wall of said airtight chamber by an electric heat;

the first and the second heating means and wires, which connect said two heating means to an electric power source are covered by tetrafluoroethylene type resin; and said airtight chamber, said silicon wafer holdings means, said acid storage container and said acid dropping means are covered with, or formed of tetrafluoroethylene type resin.

21. An etching apparatus of a silicon wafer surface according to claim 18 wherein said silicon wafer holding means comprises cooling means for cooling said silicone wafer and a pipe for supplying coolant to said cooling means, and said cooling means and pipe are covered with tetrafluoroethylene type resin.

* * * * *